United States Patent
Hsu et al.

(10) Patent No.: US 7,064,032 B2
(45) Date of Patent: Jun. 20, 2006

(54) METHOD FOR FORMING NON-VOLATILE MEMORY CELL WITH LOW-TEMPERATURE-FORMED DIELECTRIC BETWEEN WORD AND BIT LINES, AND NON-VOLATILE MEMORY ARRAY INCLUDING SUCH MEMORY CELLS

(75) Inventors: Fu Shiung Hsu, Hsinchu (TW); Chen Chin Liu, Hsinchu (TW); Lan Ting Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/627,000

(22) Filed: Jul. 25, 2003

(65) Prior Publication Data

US 2005/0020010 A1    Jan. 27, 2005

(51) Int. Cl.
*H01L 21/336* (2006.01)

(52) U.S. Cl. .................... 438/266; 438/262; 438/257
(58) Field of Classification Search ............. 438/266, 438/262, 257
See application file for complete search history.

(56) References Cited

U.S. PATENT DOCUMENTS

| | | | |
|---|---|---|---|
| 6,208,030 B1 * | 3/2001 | Tsui et al. | 257/758 |
| 6,797,566 B1 * | 9/2004 | Kobayashi et al. | 438/266 |
| 6,808,945 B1 * | 10/2004 | Wang et al. | 438/14 |
| 2003/0219944 A1 * | 11/2003 | Kato et al. | 438/257 |
| 2005/0020010 A1 * | 1/2005 | Hsu et al. | 438/257 |

* cited by examiner

*Primary Examiner*—Laura M. Schillinger
(74) *Attorney, Agent, or Firm*—Stout, Uxa, Buyan & Mullins, LLP (57) ABSTRACT

A method for forming a non-volatile memory cell includes depositing an oxide layer over a component stack including a dielectric layer over a first conductive layer. A portion of an upper section of the oxide layer is removed such that the dielectric layer is exposed. The dielectric layer and a remainder of the oxide layer upper section are removed such that upper surfaces of the oxide layer and the first conductive layer are substantially planar. A second conductive layer is formed over the upper surfaces of the first conductive layer and the oxide layer. A non-volatile memory array is formed including multiple spaced and parallel bit lines in a substrate surface. Multiple stacked layers, including an electron trapping layer, are on the substrate surface over the bit lines. Multiple spaced word lines are over the stacked layers. The word lines are parallel to one another and perpendicular to the bit lines.

13 Claims, 8 Drawing Sheets

METHOD FOR FORMING NON-VOLATILE MEMORY CELL WITH LOW-TEMPERATURE-FORMED DIELECTRIC BETWEEN WORD AND BIT LINES, AND NON-VOLATILE MEMORY ARRAY INCLUDING SUCH MEMORY CELLS

BACKGROUND OF THE INVENTION

1. Field of the Invention

The present invention relates to non-volatile memory devices and, more particularly, to localized trapped charge memory cell structures capable of storing multiple bits per cell.

2. Description of Related Art

A non-volatile semiconductor memory device is designed to maintain programmed information even in the absence of electrical power. Read only memory (ROM) is a non-volatile memory commonly used in electronic equipment such as microprocessor-based digital electronic equipment and portable electronic devices such as cellular phones.

ROM devices typically include multiple memory cell arrays. Each memory cell array may be visualized as including intersecting word lines and bit lines. Each word and bit line intersection can correspond to one bit of memory. In mask programmable metal oxide semiconductor (MOS) ROM devices, the presence or absence of a MOS transistor at word and bit line intersections distinguishes between a stored logic '0' and logic '1'. A programmable read only memory (PROM) is similar to the mask programmable ROM except that a user may store data values (i.e., program the PROM) using a PROM programmer. A PROM device is typically manufactured with fusible links at all word and bit line intersections. This corresponds to having all bits at a particular logic value, typically logic '1'. The PROM programmer is used to set desired bits to the opposite logic value, typically by applying a high voltage that vaporizes the fusible links corresponding to the desired bits. A typical PROM device can only be programmed once.

An erasable programmable read only memory (EPROM) is programmable like a PROM, but can also be erased (e.g., to an all logic '1's state) by exposing it to ultraviolet light. A typical EPROM device has a floating gate MOS transistor at all word and bit line intersections (i.e., at every bit location). Each MOS transistor has two gates: a floating gate and a non-floating gate. The floating gate is not electrically connected to any conductor, and is surrounded by a high impedance insulating material. To program the EPROM device, a high voltage is applied to the non-floating gate at each bit location where a logic value (e.g., a logic '0') is to be stored. This causes a breakdown in the insulating material and allows a negative charge to accumulate on the floating gate. When the high voltage is removed, the negative charge remains on the floating gate. During subsequent read operations, the negative charge prevents the MOS transistor from forming a low resistance channel between a drain terminal and a source terminal (i.e., from turning on) when the transistor is selected.

An EPROM integrated circuit is normally housed in a package having a quartz lid, and the EPROM is erased by exposing the EPROM integrated circuit to ultraviolet light passed through the quartz lid. The insulating material surrounding the floating gates becomes slightly conductive when exposed to the ultraviolet light, allowing the accumulated negative charges on the floating gates to dissipate.

A typical electrically erasable programmable read only memory (EEPROM) device is similar to an EPROM device except that individual stored bits may be erased electrically. The floating gates in the EEPROM device are surrounded by a much thinner insulating layer, and accumulated negative charges on the floating gates can be dissipated by applying a voltage having a polarity opposite that of the programming voltage to the non-floating gates.

Flash memory devices are sometimes called flash EEPROM devices, and differ from EEPROM devices in that electrical erasure involves large sections of, or the entire contents of, a flash memory device.

A relatively recent development in non-volatile memory is localized trapped charge devices. While these devices are commonly referred to as nitride read only memory (NROM) devices, the acronym "NROM" is a part of a combination trademark of Saifun Semiconductors Ltd. (Netanya, Israel). Each memory cell of a localized trapped charge array is typically an n-channel MOS (nMOS) transistor with an oxide-nitride-oxide (ONO) dielectric structure forming the gate dielectric. Data is stored in two separate locations adjacent to the source and drain terminals of the nMOS transistor, allowing 2 bits of data to be stored in the nMOS transistor structure. The localized trapped charge memory cells are typically programmed by channel hot electron (CHE) injection through bottom oxide layers of the ONO dielectric structures. During programming, electrical charge is trapped in the ONO dielectric structures. The localized trapped charge memory cells are erased by tunneling enhanced hot hole (TEHH) injection through bottom oxide layers of the ONO dielectric structures.

Materials formed on and/or positioned in semiconductor substrates in the manufacture of integrated circuits are subject to physical and chemical mechanisms influenced by thermal (heat) energy. More specifically, heat energy may accelerate physical and chemical mechanisms deleterious to proper operation of the integrated circuits. For this reason, "thermal budgets" are determined for semiconductor wafer fabrication processes. These thermal budgets specify maximum total quantities of thermal energy to which wafers can be subjected, and wafer processing is generally carried out such that specified thermal budgets are not exceeded.

In a known method for forming localized trapped charge memory cell structures, dopant atoms (e.g., phosphorus atoms) are introduced into substrates to form buried source/drain regions of nMOS transistor structures. These source/drain regions function as bit lines of the memory cells. Relatively thick oxide layers are grown over the buried source/drain regions to electrically isolate the buried source/drain regions from word lines subsequently formed over the oxide layers.

A problem arises in the known method in that growing the relatively thick oxide layers typically requires subjecting the substrates to relatively high temperatures for relatively long periods of time. The amount of thermal energy the substrate is subjected to during the oxide growth process may account for a substantial portion of, or even exceed, a thermal budget for the process determined at least in part by the tendency of the dopant atoms in the previously formed source/drain regions to migrate (i.e., diffuse) under elevated temperatures.

It would thus be advantageous to have a localized trapped charge memory cell structure wherein electrical isolation between word and bit lines is provided by layers of a material that can be formed using less thermal energy than an oxide growth process.

SUMMARY OF THE INVENTION

A disclosed method for forming at least one non-volatile memory cell includes forming a first oxide layer, an electron trapping layer, a second oxide layer, a first electrically conductive layer, and a dielectric layer on a surface of a substrate in that order. The dielectric layer and the first electrically conductive layer are patterned, thereby forming at least one component stack. A third oxide layer is deposited over and beside the at least one component stack. In a preferred implementation, the patterning further comprises patterning the second oxide layer, the electron trapping layer, and the first oxide layer, to thereby form the at least one component stack; and the depositing of a third oxide layer over and beside the at least one component stack is preceded by forming an oxide layer beside the component stack.

A portion of an upper section of the third oxide layer opposite the second oxide layer is removed such that an upper portion of the dielectric layer is exposed through the third oxide layer. The dielectric layer and a remaining portion of the upper section of the third oxide layer are removed such that an elevation of an upper surface of the third oxide layer above the surface of a substrate is substantially equal to an elevation of an upper surface of the patterned first electrically conductive layer. A second electrically conductive layer is formed over the upper surfaces of the patterned first electrically conductive layer and the third oxide layer.

A described non-volatile memory array includes multiple spaced and substantially parallel bit lines in a surface of a substrate. Multiple stacked layers are positioned on the surface of the substrate and over the bit lines, wherein the stacked layers include an electron trapping layer. Multiple spaced word lines are positioned over the stacked layers, wherein the word lines are substantially parallel to one another and substantially perpendicular to the bit lines. Non-volatile memory cells of the non-volatile memory array are formed using the above method. In one implementation, the depositing of the third oxide layer is carried out at a temperature lower than a temperature required to thermally grow the third oxide layer.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of localized trapped charge memory cell structures. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to localized trapped charge memory cell structures and methods of forming such structures.

Figure 1:
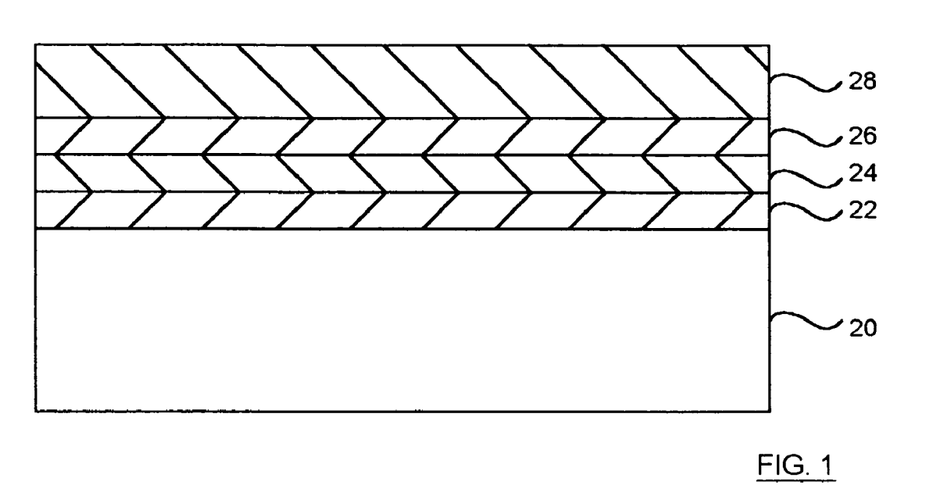
FIG. 1 is a cross-sectional view of a semiconductor substrate having a first silicon dioxide (oxide) layer formed on an upper surface, a silicon nitride (nitride) layer formed over the first oxide layer, a second oxide layer formed over the nitride layer, and a polycrystalline silicon (polysilicon) layer formed over the second oxide layer.

Referring to the drawings, FIGS. 1–10 will now be used to describe one embodiment of a method for forming localized trapped charge memory cell structures, and a non-volatile memory device including the structures. FIG. 1 is a cross-sectional view of a semiconductor substrate 20 having a first silicon dioxide (oxide) layer 22 formed on an upper surface, a silicon nitride (nitride) layer 24 formed over the first oxide layer 22, a second oxide layer 26 formed over the nitride layer 24, and a polycrystalline silicon (polysilicon) layer 28 formed over the second oxide layer 26.

The semiconductor substrate 20 may be, for example, a semiconductor wafer (e.g., a silicon wafer). The oxide layers 22 and 26 consist substantially of silicon dioxide ($SiO_2$), and may be grown and/or deposited on the upper surface of the semiconductor substrate 20. The nitride layer 24 consists substantially of silicon nitride ($Si_3N_4$), and may be deposited on an upper surface of the oxide layer 22.

The oxide layer 22, the nitride layer 24, and the oxide layer 26 form an oxide-nitride-oxide (ONO) structure. To store data, electrons are trapped in the nitride layer 24 of the ONO structure as described above. The nitride layer 24 is electrically isolated by the oxide layers 22 and 26. The oxide layers 22 and 26 are preferably thick enough that electrons trapped in the nitride layer 24 cannot easily tunnel through the oxide layers 22 and 26. Such tunneling may occur, for example, when the oxide layers 22 and 26 are less than about 50 Angstroms (A) thick. In one embodiment, the oxide layer 22 is grown or deposited to a thickness of between about 50 and 100 A, the nitride layer 24 is deposited to a thickness of between about 35 and 75 A, and the oxide layer 26 is grown or deposited to a thickness of between about 50 and 150 A.

If the oxide layer 26 is grown over the nitride layer 24 rather than deposited, some portion of the nitride layer 24 is consumed in the formation of the oxide layer 26 at a rate of about 1 A of nitride consumed to 2 A of oxide formed. Accordingly, the nitride layer 24 may, for example, be deposited to the desired thickness of 35 to 75 A plus about half the desired thickness of the oxide layer 26. For example, if it is desired for the oxide layer 26 to have a thickness of 150 A, and for the nitride layer 24 to have a thickness of 50 A, then the nitride layer 24 should initially be deposited to a thickness of 125 A (50 A+75 A).

The polysilicon layer 28 may be, for example, deposited on an upper surface of the oxide layer 26 using a chemical vapor deposition (CVD) process. The polysilicon is preferably doped to increase its electrical conductivity. During the doping, dopant atoms (e.g., phosphorus) may be introduced into the polysilicon. The doping may be carried out via a subsequent diffusion process or ion implantation process. Implantation doping of the polysilicon layer 28 may be termed "n type poly implantation." It is also possible to dope the polysilicon in-situ during the above described CVD process. In one embodiment, the polysilicon layer 28 is deposited to a thickness of between about 600 and 800 A.

Figure 2:
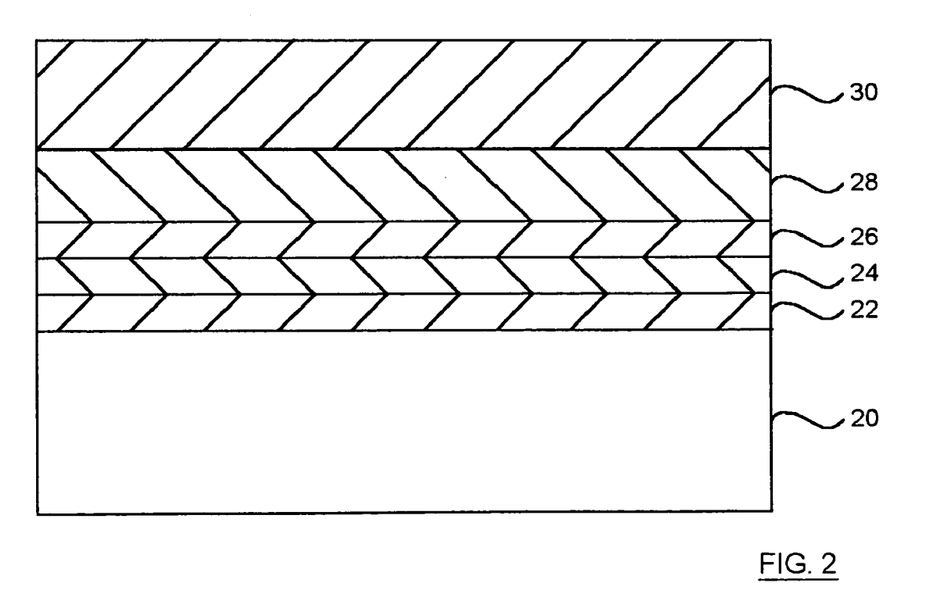
FIG. 2 is the cross-sectional view of FIG. 1 wherein a second nitride layer has been formed on an upper surface of the polysilicon layer.

FIG. 2 is the cross-sectional view of FIG. 1 wherein a nitride layer 30 has been formed on an upper surface of the polysilicon layer 28. The nitride layer 30 consists substantially of silicon nitride ($Si_3N_4$), and may be deposited on the upper surface of the polysilicon layer 28. In one embodiment, the nitride layer 30 is deposited to a thickness between about 800 A to 2000 A.

Figure 3:
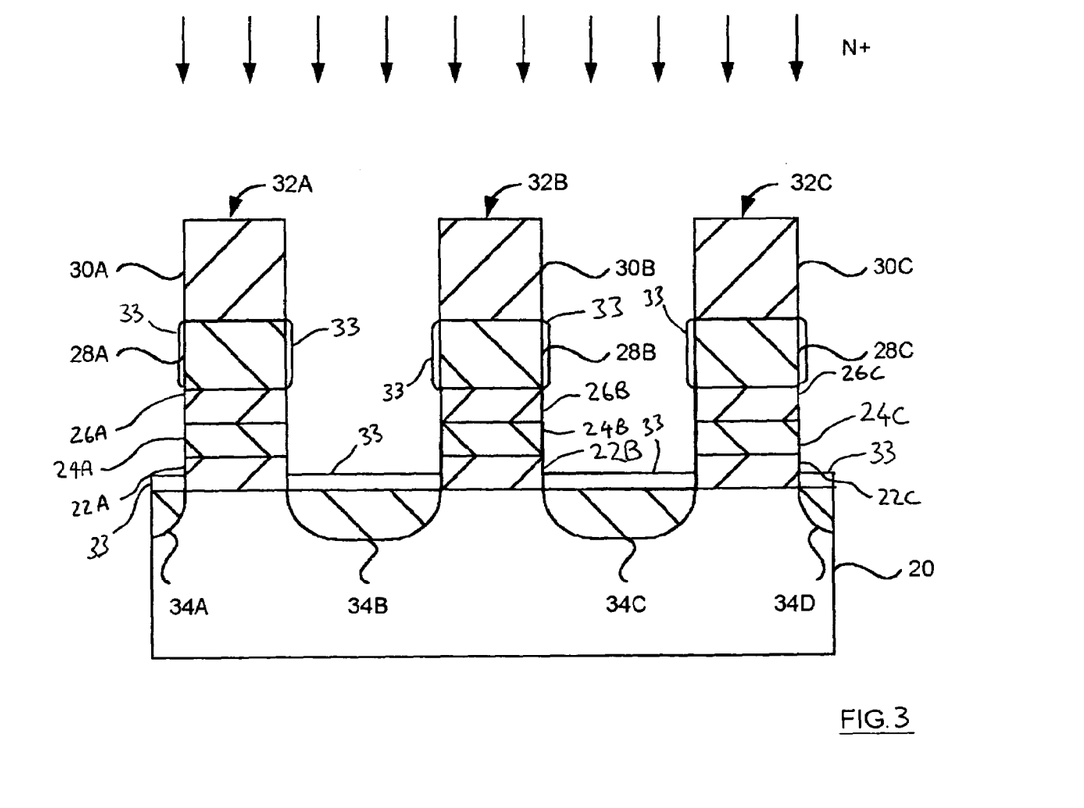
FIG. 3 is the cross-sectional view of FIG. 2 following patterning of the second nitride layer and the polysilicon layer, thereby forming component stacks on the upper surface of the second oxide layer, and during introduction of n-type dopant atoms (n+) into unprotected areas of the upper surface of the semiconductor substrate.

FIG. 3 is the cross-sectional view of FIG. 2 following a patterning process and during introduction of n-type dopant atoms (n+) into unprotected areas of the upper surface of the semiconductor substrate 20. The nitride layer 30 and the polysilicon layer 28 may be patterned by forming and patterning a layer of a photoresist material on an upper surface of the polysilicon layer 28, and using the resulting photoresist features as etching masks. In the illustrated embodiment, the patterning process etches unprotected portions of the nitride layer 30 and the polysilicon layer 28, and further etches unprotected portions of the oxide layer 26, the nitride layer 24, and the oxide layer 22 after which time an oxide layer 33 is grown to remove etch damage.

The etching operation may include, for example, multiple etching processes performed in sequence. For example, a first etch process may be a selective etch process (e.g., a dry plasma etch process) in which the selectivity of nitride to polysilicon is high. A second etch process may be a selective etch process (e.g., a dry plasma etch process) in which the selectivity of polysilicon to oxide is high. A third etch process may be a selective etch process (e.g., a dry plasma etch process) in which the selectivity of ONO to silicon-substrate is high.

The patterning of the nitride layer 30 produces nitride layers 30A–30C, the patterning of the polysilicon layer 28 produces polysilicon layers 28A–28C, the patterning of the oxide layer 26 produces oxide layers 26A–26C, the patterning of the nitride layer 24 produces nitride layers 24A–24C, and the patterning of the oxide layer 22 produces oxide layers 22A–22C. As indicated in FIG. 3, the stacked oxide layer 22A, nitride layer 24A, oxide layer 26A, polysilicon layer 28A, and nitride layer 30A form a component stack 32A. The stacked oxide layer 22B, nitride layer 24B, oxide layer 26B, polysilicon layer 28B, and nitride layer 30B form a component stack 32B. The stacked oxide layer 22C, nitride layer 24C, oxide layer 26C, polysilicon layer 28C, and nitride layer 30C form a component stack 32C. Following the patterning of the nitride layer 30, the polysilicon layer 28, the oxide layer 26, the nitride layer 24, and the oxide layer 22, the silicon substrate 20 is substantially unaffected as shown in FIG. 3.

Following the patterning of the nitride layer 30, the polysilicon layer 28, the oxide layer 26, the nitride layer 24, and the oxide layer 22 to form the component stacks 32A–32C, the oxidation layer 33 (oxidation for etch damage removal) is formed using, for example, a furnace process, on the substrate to a thickness of, for example, about 20 A to about 100 A. Following the oxidation process, the n-type dopant atoms (n+) are introduced into regions of the upper surface of the semiconductor substrate 20 surrounding the component stacks 32A–32C. The n-type dopant atoms may be, for example, phosphorus atoms, and may be introduced into the unprotected areas of the upper surface of the semiconductor substrate 20 via chemical diffusion or ion implantation. The semiconductor substrate 20 may then be subjected to a heating operation for drive in (following chemical diffusion) or anneal (following ion implantation).

During the introduction of the n-type dopant atoms, n-type dopant atoms pass through the oxide layer 33 and form buried source/drain regions 34A–34D in the semiconductor substrate 20 as indicated in FIG. 3. The buried source/drain regions 34A–34D are advantageously aligned with the component stacks 32A–32C.

Figure 4:
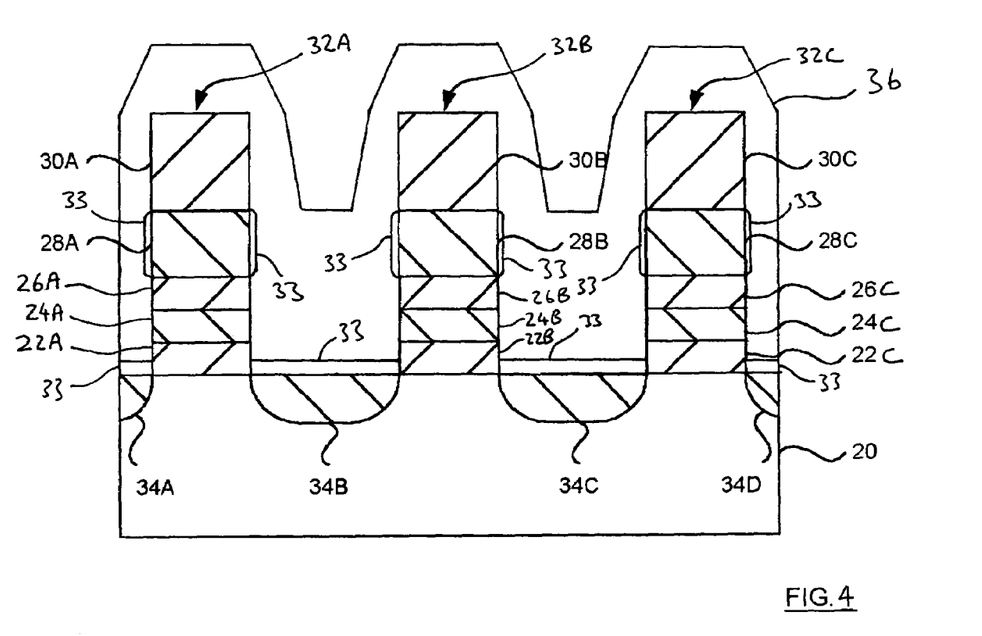
FIG. 4 is the cross-sectional view of FIG. 3 following the depositing of a third oxide layer over the component stacks on the upper surface of the second oxide layer and over the regions of the upper surface of the second oxide layer surrounding the component stacks.

FIG. 4 is the cross-sectional view of FIG. 3 following the depositing of an oxide layer 36 over the component stacks 32A–32C and over regions of the oxide layer 33 beside the component stacks 32A–32C. The oxide layer 36 may be deposited via CVD, and preferably has a thickness of between about 1200 A and 3000 A.

The oxide layer 36 is preferably a high density plasma (HDP) CVD oxide layer. In a suitable HDP CVD process, the semiconductor substrate 20 is placed between a pair of electrodes in a reaction chamber, and SiH$_4$, O$_2$, and Ar gases are introduced into the reaction chamber at flow rates of approximately 150 sccm, 225 sccm, and 100 sccm, respectively. The HDP CVD oxide layer is thus formed over the component stacks 32A–32C on the upper surface of the oxide layer 33 and over the regions of the upper surface of the oxide layer 33 surrounding or beside the component stacks 32A–32C.

As will become evident below, the oxide layer 36 will be used to electrically isolate buried source/drain regions functioning as bit lines from word lines subsequently formed over the oxide layer 36. The formation of the oxide layer 36 via deposition at a relatively lower temperature can advantageously reduce dopant atom migration from the source/drain regions 34A–34D, and can have other advantages. Depositing the oxide layer 36 at a lower temperature than otherwise required to grow the oxide layer 36 can reduce the impact of the forming of the oxide layer 36 on a thermal budget of the process, and may lower the thermal budget of the process. As described above, the thermal budget of the process may be determined at least in part by the tendency of the dopant atoms in previously formed source/drain regions (e.g., the source/drain regions 34A–34D) to migrate (i.e., diffuse) under elevated temperatures. Further, the deposited oxide layer 36 can be more uniform than a grown oxide layer, both in thickness and in lack of voids. As a result, the deposited oxide layer 36 can have a higher electrical breakdown voltage than a grown oxide positioned between the bit lines and the word lines.

Figure 5:
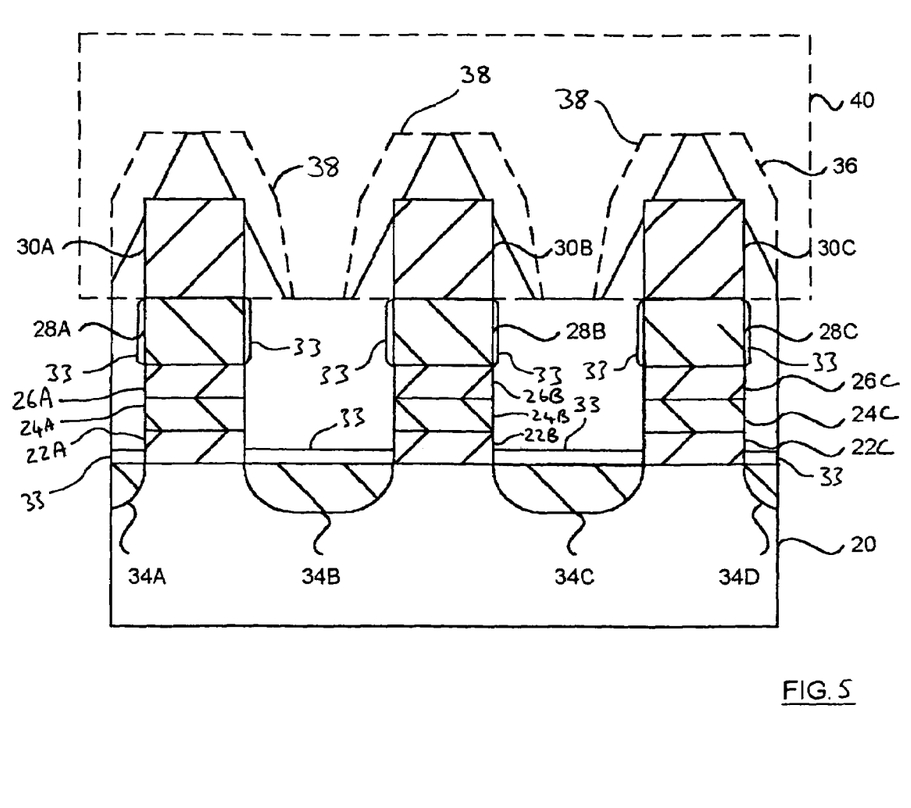
FIG. 5 is the cross-sectional view of FIG. 4 following removal of portions of an upper section the third oxide layer.

FIG. 5 is the cross-sectional view of FIG. 4 following removal of portions 38 of an upper section 40 of the oxide layer 36. Removal of the portions 38 may be accomplished via, for example, wet etch dipping of the oxide layer 36. The wet etch dipping may be carried out by inverting the semiconductor substrate 20 and dipping the upper section 40 of the oxide layer 36 in an etchant solution comprising, for example, hydrofluoric acid (HF). The etchant solution may be, for example, a dilute HF solution, and may include a buffer against unwanted generation of hydrogen ions (e.g., ammonium fluoride, NH$_4$F). The removal processes is halted when upper edges of the nitride layers 30A–30C are exposed through the oxide layer 36 in the upper section 40 as indicated in FIG. 5.

Figure 6:
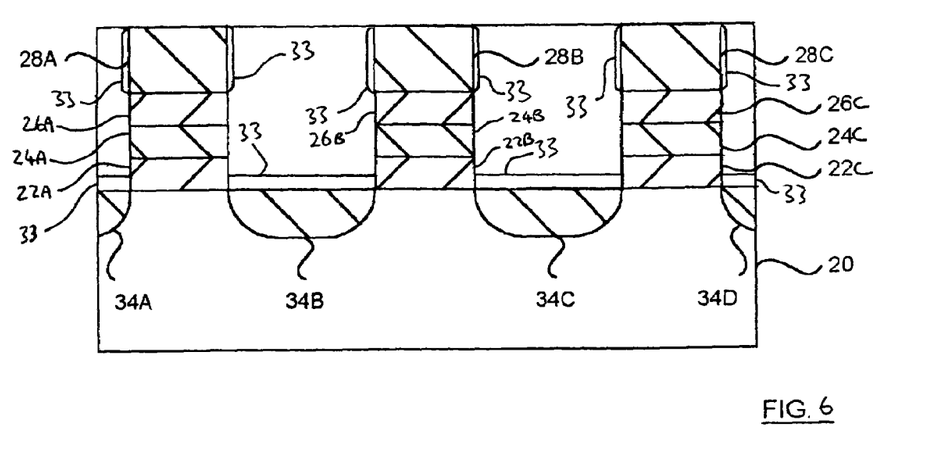
FIG. 6 is the cross-sectional view of FIG. 5 following removal of the remaining second nitride layers and a remainder of the upper section of the third oxide layer.

FIG. 6 is the cross-sectional view of FIG. 5 following removal of the nitride layers 30A–30C and a remainder of the upper section 40 of the oxide layer 36. The nitride layers 30A–30C may be removed via, for example, a selective wet etch process (e.g., hot H$_3$PO$_4$ at 75C) in which the selectivity of nitride to oxide is adjusted to remove the nitride layers 30A–30C and the remainder of the upper section 40 of the oxide layer 36 without removing a significant amount of the remaining portion of the oxide layer 36 (shown in FIG. 6).

Figure 7:
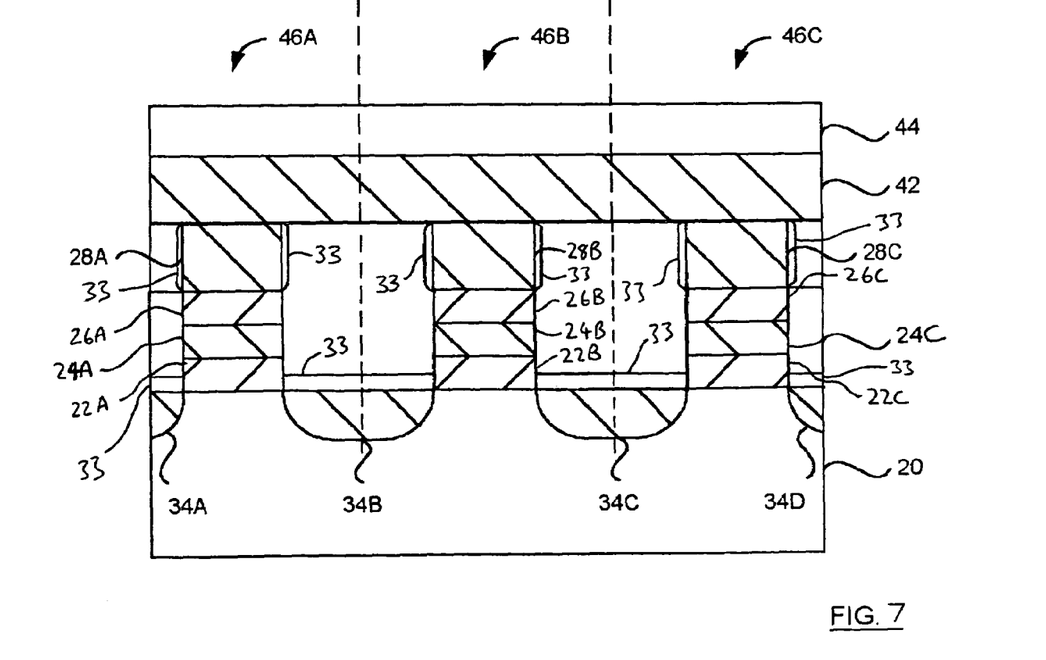
FIG. 7 is the cross-sectional view of FIG. 6 wherein a second polysilicon layer has been formed over the remaining first polysilicon layers and the remaining portion of the third oxide layer, and an electrically conductive layer has been formed over the second polysilicon layer, wherein 3 localized trapped charge memory cell structures are shown having been formed.

As indicated in FIG. 6, the nitride layers 30A–30C and the remainder of the upper section 40 of the oxide layer 36 are removed such that an elevation of an upper surface of the oxide layer 36 above the surface of the semiconductor substrate 20 is substantially equal to elevations of upper surfaces of the polysilicon layers 28A–28C. FIG. 7 is the cross-sectional view of FIG. 6 wherein a polysilicon layer 42 has been formed over the polysilicon layers 28A–28C and the remaining portion of the oxide layer 36, and an electrically conductive layer 44 has been formed over the polysilicon layer 42. The polysilicon layer 42 may be, for example, deposited on upper surfaces of the polysilicon layers 28A–28C and the remaining portion of the oxide layer 36 using a chemical vapor deposition (CVD) process. The interfaces between the polysilicon layer 42 and the polysilicon layers 28A–28C should form Ohmic contacts without interface contaminations. The polysilicon layer 42 is preferably doped to increase its electrical conductivity. During the doping, dopant atoms (e.g., phosphorus) may be introduced into the polysilicon. The doping may be carried out via a subsequent diffusion process or ion implantation process. It is also possible to dope the polysilicon in-situ during the above described CVD process.

The electrically conductive layer 44 may be, for example, a metal-silicide layer. In one embodiment the electrically conductive layer 44 is a tungsten silicide layer (WSix). Metal-silicides such as tungsten silicide are commonly deposited via CVD to form electrically conductive layers.

In FIG. 7, 3 localized trapped charge memory cell structures 46A–46C have been formed. All 3 localized trapped charge memory cell structures 46A–46C include the oxide layer 22, the nitride layer 24, and the oxide layer 26. The nitride layer 24 functions as an electron trapping layer in all 3 localized trapped charge memory cell structures 46A–46C. The localized trapped charge memory cell structure 46A includes the polysilicon layer 28A and portions of the buried source/drain regions 34A and 34B. The localized trapped charge memory cell structure 46B includes the polysilicon layer 28B and portions of the buried source/drain regions 34B and 34C, and the localized trapped charge memory cell structure 46C includes the polysilicon layer 28C and portions of the buried source/drain regions 34C and 34D.

Figure 8:
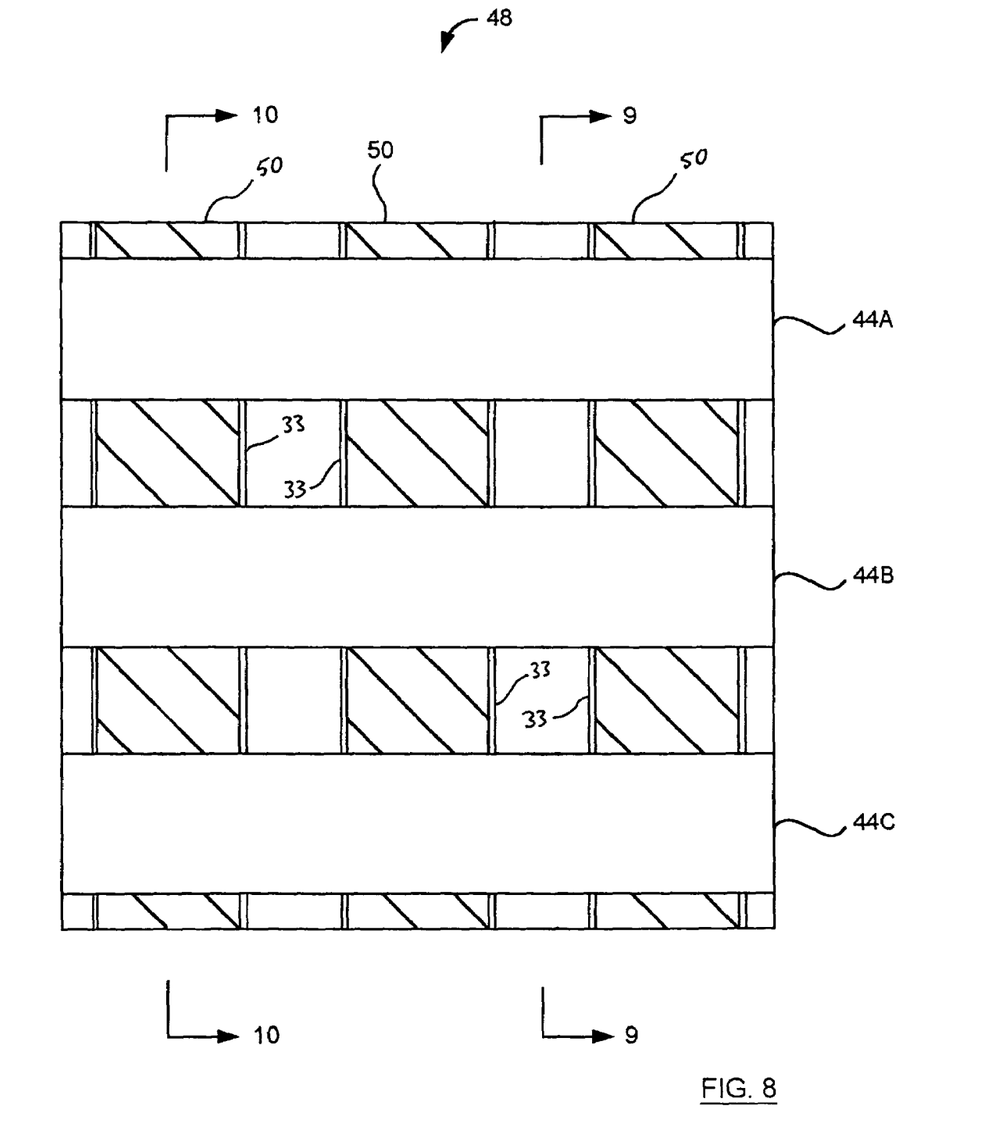
FIG. 8 is a top plan view of a non-volatile memory array including the localized trapped charge memory cell structures of FIG. 7 following patterning of the electrically conductive layer and the second polysilicon layer to form word lines.

FIG. 8 is a top plan view of a non-volatile memory array 48 including the localized trapped charge memory cell structures 46A–46C of FIG. 7 following patterning of the electrically conductive layer 44, the polysilicon layer 42, and polysilicon 28A–28C to form word lines 44A, 44B, and 44C. In FIG. 8, buried source/drain regions 50 form 3 of the 4 bit lines shown in FIG. 7.

Figure 9:
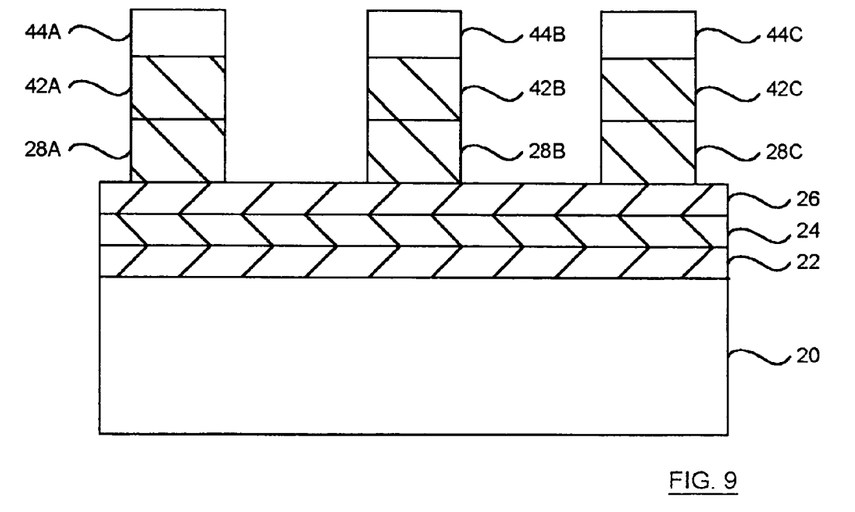
FIG. 9 is a sectional view of the non-volatile memory array of FIG. 8 as indicated in FIG. 8.
Figure 10:
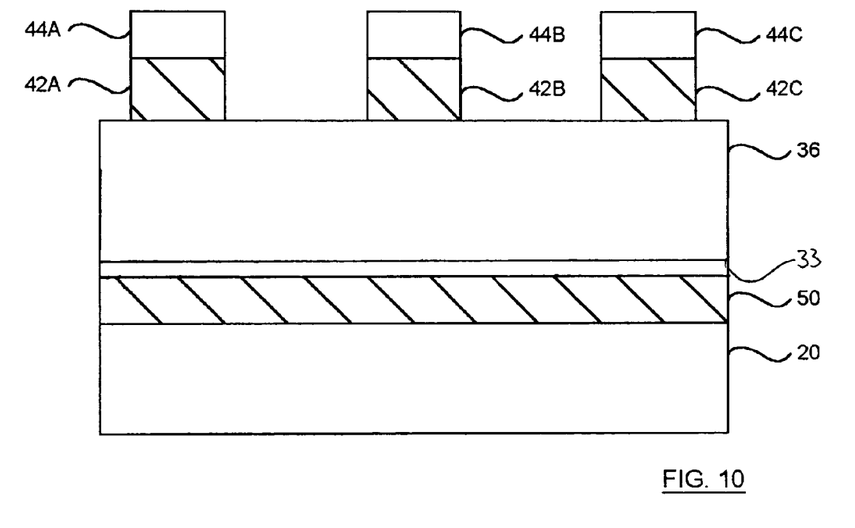
FIG. 10 is a sectional view of the non-volatile memory array of FIG. 8 as indicated in FIG. 8.

FIG. 9 is a sectional view of the non-volatile memory array 48 of FIG. 8 as indicated in FIG. 8, and FIG. 10 is a sectional view of the non-volatile memory array 48 of FIG. 8 as indicated in FIG. 8.

In view of the foregoing, it will be understood by those skilled in the art that the methods of the present invention can facilitate formation of read only memory devices, and in particular read only memory devices exhibiting localized charge trapping, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description.

Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method for fanning at least one non-volatile memory cell, comprising:
(a) forming a first oxide layer, an electron trapping layer, a second oxide layer, a first electrically conductive layer, and a dielectric layer on a surface of a substrate in that order;

(b) patterning the dielectric layer and the first electrically conductive layer, thereby forming at least one component stack;
(c) depositing a third oxide layer over and beside the at least one component stack;
(d) removing a portion of an upper section of the third oxide layer opposite the second oxide layer such that an upper portion of the dielectric layer is exposed through the third oxide layer;
(e) removing the dielectric layer and a remaining portion of the upper section of the third oxide layer such that an elevation of an upper surface of the third oxide layer above the surface of the substrate is substantially equal to an elevation of an upper surface of the patterned first electrically conductive layer; and
(f) forming a second electrically conductive layer over upper surfaces of the patterned first electrically conductive layer and the third oxide layer.

2. The method as recited in claim 1, wherein the depositing of a third oxide layer comprises depositing a third oxide layer over and beside the component stack via a high density plasma chemical vapor deposition (HDP CVD) process.

3. The method as recited in clam 1, wherein the depositing of a third oxide layer is carried out at a temperature lower than a temperature required to thermally grow the third oxide layer.

4. The method as recited in claim 1, wherein the depositing of a third oxide layer is carried out such that the third oxide layer has a thickness between about 1200 Angstroms and approximately 1400 Angstroms.

5. The method as recited in claim 1, wherein the removing of a portion of an upper section of the third oxide layer comprises dipping the portion of the upper section in an etchant solution.

6. The method as recited in claim 1, wherein the electron trapping layer comprises silicon nitride.

7. The method as recited in claim 1, wherein the first electrically conductive layer comprises doped polysilicon.

8. The method as recited in claim 1, wherein the dielectric layer comprises silicon nitride.

9. The method as recited in claim 1, wherein the second electrically conductive layer comprises doped polysilicon.

10. The method as recited in claim 1, wherein:
the patterning further comprises patterning the second oxide layer, the electron trapping layer, and the first oxide layer, to thereby form the at least one component stack; and
the depositing of a third oxide layer over and beside the at least one component stack is preceded by forming an oxide layer beside the component stack.

11. A semiconductor structure formed using the method set forth in claim 10.

12. A semiconductor structure formed using the method set forth in claim 1.

13. A semiconductor structure formed using the method set forth in claim 3.

* * * * *